(12) United States Patent
Schott et al.

(10) Patent No.: US 7,332,923 B2
(45) Date of Patent: Feb. 19, 2008

(54) TEST PROBE FOR HIGH-FREQUENCY MEASUREMENT

(75) Inventors: Steffen Schott, Dresden (DE); Stojan Kanev, Thiendorf OT Sacka (DE)

(73) Assignee: SUSS MicroTec Test Systems GmbH, Sacka (DE)

( * ) Notice: Subject to any disclaimer, the term of this patent is extended or adjusted under 35 U.S.C. 154(b) by 0 days.

(21) Appl. No.: 11/368,748

(22) Filed: Mar. 6, 2006

(65) Prior Publication Data

US 2007/0145987 A1    Jun. 28, 2007

(30) Foreign Application Priority Data

Nov. 4, 2005    (DE)    ............... 10 2005 053 146

(51) Int. Cl.
*G01R 1/067*    (2006.01)
*G01R 31/02*    (2006.01)
*H01R 11/00*    (2006.01)

(52) U.S. Cl. ............... 324/762; 324/754; 324/72.5

(58) Field of Classification Search ............... 324/72.5, 324/762
See application file for complete search history.

(56) References Cited

U.S. PATENT DOCUMENTS

| | | | | |
|---|---|---|---|---|
| 4,871,964 A | | 10/1989 | Boll et al. ............... | 324/158 |
| 4,983,910 A | * | 1/1991 | Majidi-Ahy et al. ........ | 324/754 |
| 5,502,372 A | * | 3/1996 | Quan ............... | 324/72.5 |
| 5,506,515 A | | 4/1996 | Godshalk et al. ............ | 324/762 |
| 6,229,327 B1 | * | 5/2001 | Boll et al. ............... | 324/762 |
| 6,400,168 B2 | * | 6/2002 | Matsunaga et al. ........ | 324/754 |
| 6,815,963 B2 | | 11/2004 | Gleason et al. ............ | 324/754 |
| 6,967,473 B1 | * | 11/2005 | Reed et al. ............... | 324/149 |
| 7,056,134 B2 | * | 6/2006 | Martin et al. ............... | 439/169 |
| 7,064,564 B2 | * | 6/2006 | Kister et al. ............... | 324/715 |
| 7,208,966 B2 | * | 4/2007 | Aoyagi et al. ............. | 324/762 |
| 2001/0038294 A1 | * | 11/2001 | Matsunaga et al. ........ | 324/754 |
| 2005/0024069 A1 | * | 2/2005 | Hayden et al. ............ | 324/754 |

* cited by examiner

*Primary Examiner*—Anjan Deb
*Assistant Examiner*—John Zhu
(74) *Attorney, Agent, or Firm*—Heslin Rothenberg Farley & Mesiti P.C.

(57) ABSTRACT

A test probe for executing high-frequency measurements comprises: a coaxial high-frequency wave guide containing an inner conductor and an outer conductor for delivering a primary electrical potential and a secondary electrical potential, respectively, a supporting structure conductively connected to at least the outer conductor and to at least two contact elements for creating a contact with an electronic circuit to be tested. The support structure is provided with conductive paths for the transmission respectively of a high-frequency signal from the inner conductor and a high-frequency ground potential from the outer conductor to at least one contact element and each conductive path is conductively connected to the inner or outer conductor. The support structure has at least one U-shaped cut-out with a width essentially equivalent to an outer diameter of the wave guide and sides of the U-shaped cut-out are connected to the outer conductor.

18 Claims, 4 Drawing Sheets

TEST PROBE FOR HIGH-FREQUENCY MEASUREMENT

BACKGROUND OF THE INVENTION

The invention is a test probe for executing high-frequency measurements, in particular, for the measurement of electrical parameters during the testing of electronic circuits.

U.S. Pat. No. 4,871,964 Boll et al. "Integrated Circuit Probing Apparatus" proposes a test probe in which the inner conductor of a coaxial cable is first used to form the test probe that transmits the test signal to enable the inner conductor itself to be used directly to test an integrated circuit. The high-frequency ground potential, which is conducted by the outer conductor of the coaxial cable, is applied to the integrated circuit by means of two secondary contact tips that are finished as curved strips and soldered to the outer conductor.

In contrast to this, U.S. Pat. No. 5,506,515 Godshalk et al. "High-Frequency Probe Tip Assembly" proposes removing approximately half of the material at the freely suspended end of the coaxial cable so as to produce a flat plane, whose central area is formed by the inner conductor and whose outer areas are formed by the outer conductor of the coaxial cable. These areas are electrically insulated from one another by the dielectric fitted between the inner and outer conductors. Three coplanar contact points are soldered to this console and are used to transmit the test signal and the high-frequency ground potential to the integrated circuit to be tested.

The fundamental idea of attaching a test probe to this type of console is also adopted in U.S. Pat. No. 6,815,963 Gleason et al. "Probe for Testing a Device under Test". However, this solution involves integrating all three measuring points into a common circuit card and fitting an elongate conductor to the top side of the circuit card. This conductor transmits the test signal from the inner conductor to the free end of the circuit board and transmits the high-frequency ground potential via at least one conductive element on the lower surface of the circuit card to its freely-suspended end. Contact elements are formed along the lower surface of the circuit card and are electrically connected to the elongate conductor and to the conductive element(s) for the purpose of transmitting the test signal and the high-frequency ground potential to the integrated circuit board to be tested. The elongate conductor on the top side is connected to a contact element on the lower surface of the circuit card by means of a conductive path running through the circuit card.

BRIEF SUMMARY OF THE INVENTION

This invention is designed to provide an improved test probe that can be manufactured cost effectively and that enables a high degree of measurement accuracy.

Pursuant to the present invention, the test probe for executing high-frequency measurements, in particular, for measuring electrical parameters during the testing of electronic circuits, incorporates a coaxial high-frequency wave guide containing an inner and an outer conductor for the purpose of delivering a primary electrical potential (high-frequency signal) transmitted by the inner conductor compared with a secondary electrical potential (high-frequency ground potential) transmitted by the outer conductor. The invention also includes a supporting structure that is connected to at least the outer conductor and to which contact elements can be attached, as well as at least two contact elements that form a conductive connection with the supporting structure and that are used for the purpose of making contact with an electronic circuit to be tested. In this case, the supporting structure features one conductive path each for the transmission of a high-frequency signal and high-frequency ground potential respectively by the inner conductor and outer conductor of the coaxial high-frequency wave guide to at least one contact element, whereby each conductive path is electrically connected to the inner conductor or the outer conductor, characterized by the fact that the supporting structure has at least one U-shaped cut-out formed by a base and two sides, whereby the measured width (clear width) between the sides of the U-shaped cut-out is essentially equivalent to the outside diameter of the coaxial high-frequency wave guide and by the fact that the sides of the U-shaped cut-out are connected to the outer conductor.

The U-shaped cut-out ensures that the process of manufacturing the test probe pursuant to the present invention is straightforward and cost-effective. The cost of manufacturing the plane familiar on the basis of the best available technology is dispensed with. The supporting structure is externally attached to the outer conductor of the coaxial high-frequency wave guide. The attachment may be formed using bonding or soldering or another cost-effective method. The area of attachment is restricted to the exterior of the coaxial high-frequency wave guide in order to prevent any adverse effects that may arise in the case of attachment to a plane, that is, in the area between the inner and outer conductors.

In one embodiment of the invention, the supporting structure features at least one essentially level surface. The level surface facilitates to a considerable degree the attachment of the conductive paths to the supporting structure and the alignment of the contact elements, the tips of which should generally lie in a single plane.

In a further embodiment of the invention, the contact element and the conductive paths are combines to form a coplanar wave guide.

The coplanar wave guide formed by the combination of the transmission paths and the contact element offers the advantage of an impedance within the range of 10 to 200 ohm, preferably of 40 to 60 ohm and, ideally, of 50 ohm.

In a further embodiment of the invention, the contact elements are formed in such a way that they themselves form the conductive paths. For this purpose, the contact elements may be of a sufficient length to enable one end to form a direct conductive connection respectively with the inner or outer conductor of the coaxial high-frequency wave guide.

In this case, there is no need to provide the supporting structure itself with conductive paths.

In a further embodiment of the invention, the supporting structure uses an essentially plate-like configuration. This allows the supporting structures to be manufactured using materials commonly used in the manufacture of printed circuit boards and similar products. The supporting element can thus be manufactured cost-effectively using existing manufacturing plant. Furthermore, the process of creating the conductive paths on the supporting structure is simplified.

In a further embodiment of the invention, all the conductive paths are arranged on the same surface of the supporting structure. The advantage of this configuration is that the process of manufacturing the supporting structures is simpler and therefore more cost-effective because all the conductive paths can be manufactured in a single processing step.

In a further embodiment of the invention, at least two contact elements protrude from the supporting structure, along its longitudinal axis. Depending on the intended application of the test probe, it may be beneficial for some or all of the contact elements to protrude in the longitudinal direction, that is, on the side of the supporting structure that is opposite to the coaxial high-frequency wave guide. This can be used to increase the precision of the contact to the circuit to be tested.

The contact elements protruding along the longitudinal axis of the support structure offer the advantage of elastic properties.

The present invention improves the contact behaviour in comparison to existing solutions by providing longer and simultaneously elastic contacts that are attached together to the supporting structure and that protrude from it longitudinally.

In a further and especially advantageous embodiment of the invention, the base of the U-shaped cut-out features at least one additional recess, whose width is less than the width of the U-shaped cut-out. Since the inner conductor must protrude beyond the outer conductor by a certain extent to ensure that the electrical connection to a conductive path can easily be established, it is useful to provide for a small additional recess to accept the section of the inner conductor the protrudes beyond the outer conductor. This additional recess can also have the form of a U-shaped cut-out, for example.

Naturally, it is also possible to design the U-shaped cut-out somewhat deeper than is actually necessary in order to securely attach the supporting structure, so that the remaining space between the end of the outer conductor and the base of the U-shaped cut-out can accept the end of the inner conductor that protrudes beyond the outer conductor. However, the advantage of the design featuring an additional and narrower recess in the base of the U-shaped cut-out is that supporting element in the base of the U-shaped cut-out has gradations that can be used as mechanical stops to aid the correct positioning of the support structure in relation to the outer conductor.

In a further embodiment of the invention, the support structure is designed to permit the several coaxial high-frequency wave guides to be accepted simultaneously. Test probes of this type can also be of great benefit in what are referred to as multi-port tests. These tests are characterized by the requirement for simultaneous on-wafer contact using multiple high-frequency signal contacts. These types of measurements are increasingly required for differential high-frequency circuits or for high-speed digital signals. In this case, the contact on wafer is especially difficult due to the increasing number of contacts. However, this invention addresses this difficulty. An additional improvement of feasibility in practice also arises in respect of ultra-high GHz frequencies.

In a beneficial development of this object, the single U-shaped cut-out is designed to accept multiple coaxial high-frequency wave guides, whereby the width of the U-shaped cut-out is essentially equivalent to the overall width of the coaxial high-frequency wave guides to be accommodated. Based on a further alternative development of the support structure designed to accommodate multiple coaxial high-frequency wave guides simultaneously, the support structure features multiple U-shaped cut-outs, each one of which is designed to accept a coaxial high-frequency wave guide.

BRIEF DESCRIPTION OF THE DRAWINGS

The invention is described below in more detail on the basis of sample configurations and associated drawings. In this case

DETAILED DESCRIPTION

Figure 1:
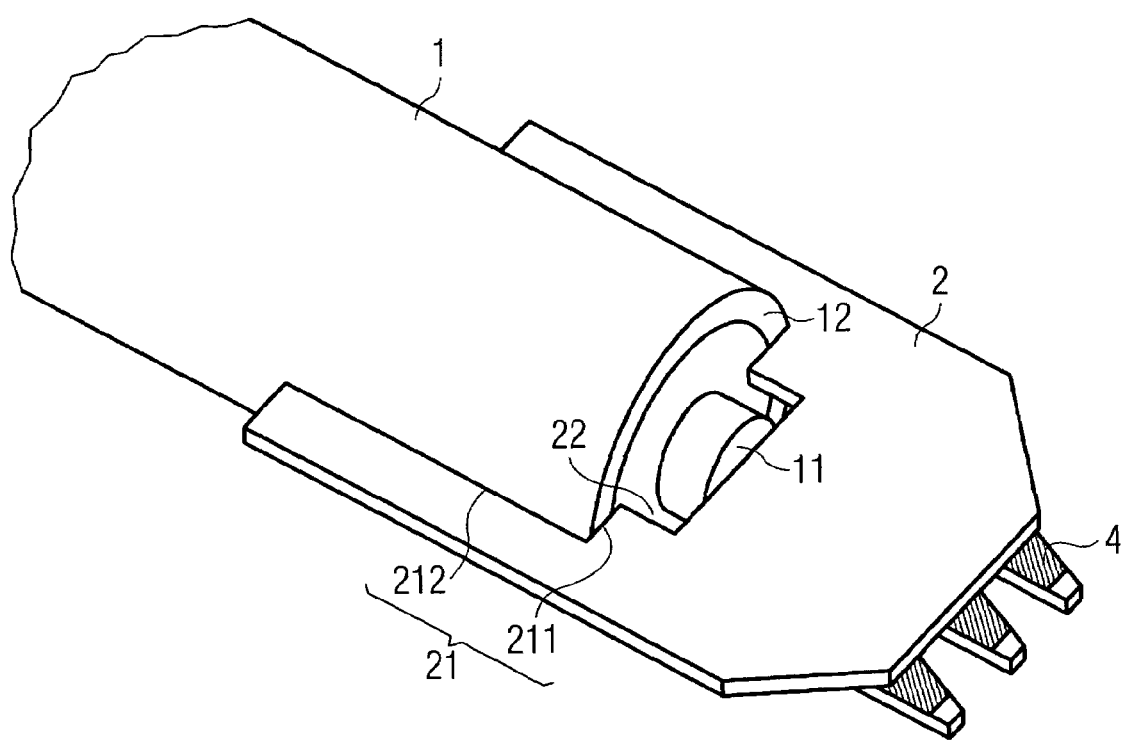
FIG. 1 illustrates an exploded view of an initial sample configuration of the invention

FIG. 1 illustrates an initial sample configuration of the test probe pursuant to the present invention for the measurement of high frequencies. This configuration includes a coaxial high-frequency wave guide 1 with an inner conductor 11 and an outer conductor 12, and a support structure 2 that is connected to the outer conductor 12 as well as three contacts 4 that are conductively connected to the support structure 2. The support structure 2 features one conductive path 31 leading from the inner conductor 11 of the coaxial high-frequency wave guide 1 to one of the three contact elements 4 and two conductive paths 31 leading from the outer conductor 12 of the coaxial high-frequency wave guide and each forming a conductive connection with one of the three contact elements 4. One end of each of these conductive paths 31 forms a conductive connection with the inner conductor 11 or the outer conductor 12, with the other end connected to one of the three contact elements 4. The conductive paths 31 are not visible in the illustration of FIG. 1 because they are located on the lower surface of the support structure but are generally depicted in the related side view of FIG. 4A.

The support structure 2 features a U-shaped cut-out 21 including a base 211 and two sides 212. The measured width between the sides 212 of the U-shaped cut-out 21, that is, the clear width of the cut-out, is essentially equivalent to the outside diameter of the coaxial high-frequency wave guide 1 and the sides 212 of the U-shaped cut-out 21 are connected to the outer conductor 12.

The support structure 2 is of an essentially plate-like configuration and, therefore, has two essentially level surfaces. All conductive paths 31 are arranged on the same surface of the support structure 2. In this representation, they are arranged on the lower surface.

The three contact elements 4 protrude longitudinally from the support structure 2, that is, they extend out from the outer edge of the support structure.

The U-shaped cut-out 21 has an additional recess 22 set into its base 211. The width of this recess 22 is less than the width of the U-shaped cut-out 21, with the result that the lateral areas of the base 211 of the U-shaped cut-out 21 can serve as a stop and thus as an aid to positioning during assembly of the test probe. The inner conductor 11 of the coaxial high-frequency wave guide 1 extends into the additional recess 22 on the base 211 of the U-shaped cut-out 21 and is butt-jointed to the base of the additional recess 22. Not shown is the conductive connection between the inner conductor 11 and a conductive path 31 located on the lower surface of the support structure 2. This conductive path 31 is conductively connected to the middle of the three contact elements 4.

Figure 2:
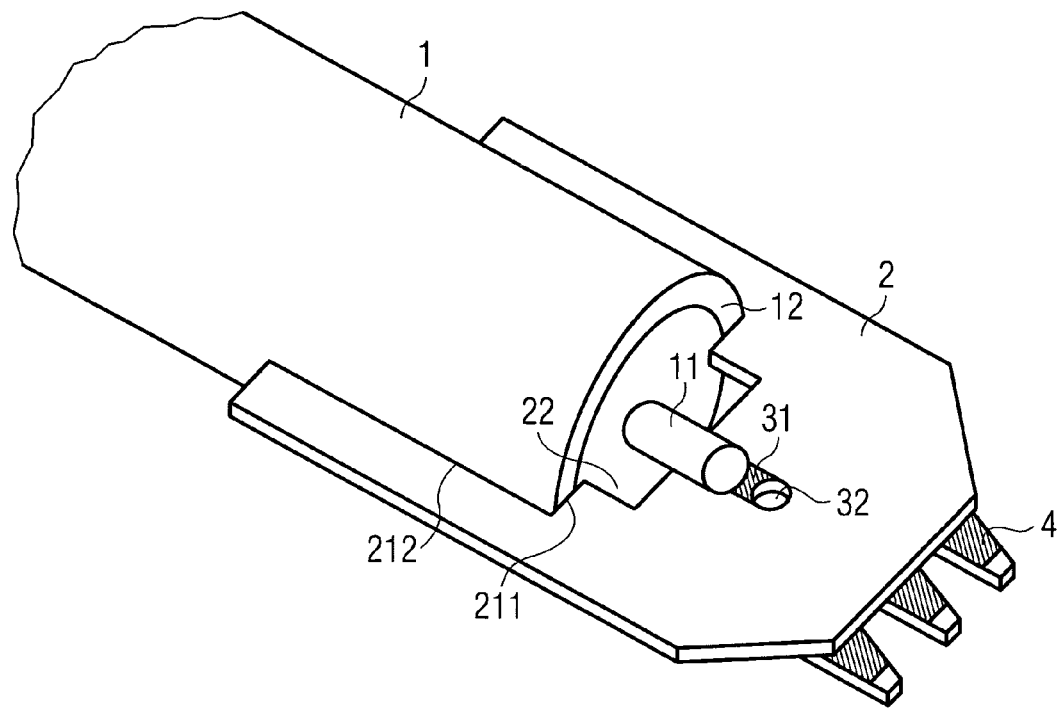
FIG. 2 illustrates an exploded view of a second sample configuration of the invention

The variant in FIG. 2 is very similar to that shown in FIG. 1. The difference between them is centered primarily on the type of conductive connection between the inner conductor 11 and the conductive path 31.

The inner conductor 11 lies on the upper surface of the support structure 2, so that the inner conductor 11 partially overlaps the support structure 2 and is conductively connected to a conductive path 31 arranged there. In the central area of the upper surface of the support structure 2, the conductive path 31 is fed through an opening 32 in the support structure 2 to its lower surface, where it extends up to the edge of the support structure 2 and is conductively connected to the middle of the three contact elements 4. The conductive paths 31 running from the outer conductor 12 to the two other contact elements 4 are not visible in the illustration because they are arranged on the lower surface of the support structure 2. However, they could be routed from the upper to the lower surface of the support structure 2 in the same way through an opening 32.

Figure 3:
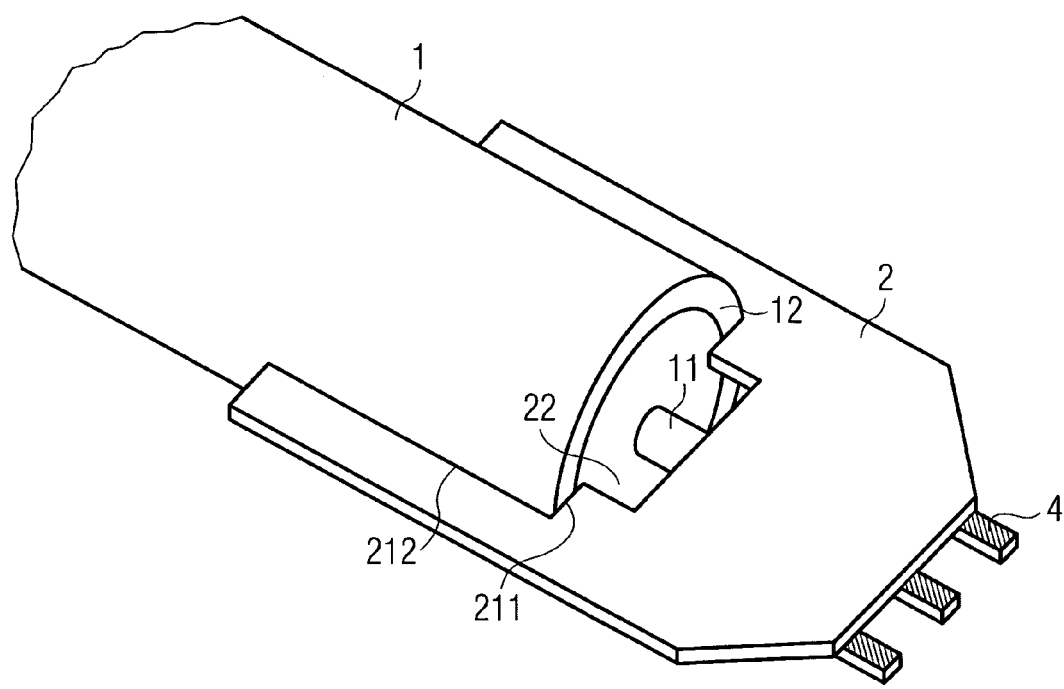
FIG. 3 illustrates an exploded view of a third sample configuration of the invention

FIG. 3 shows another variant of the test probe pursuant to the present invention in which the inner conductor 11 lies on the lower surface of the support structure, where it is conductively connected to a conductive path 31. This configuration, in turn, offers the advantage that all conductive paths 31 are arranged on only one side of the support structure 2, which simplifies the manufacturing process and reduces the associated costs.

Figure 4A:
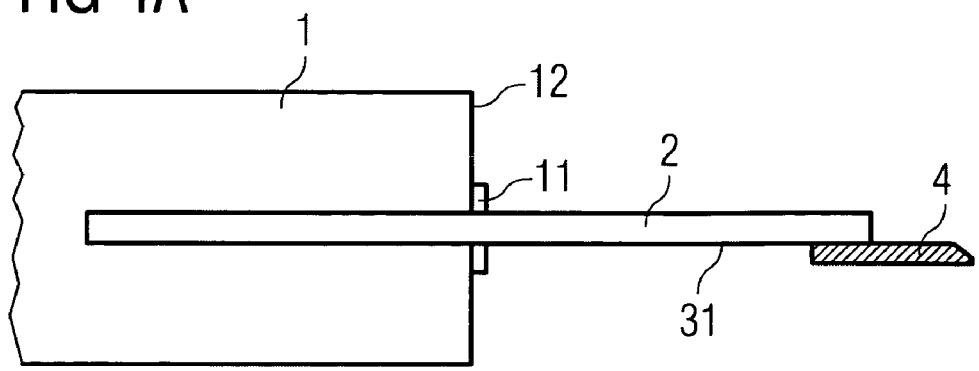
FIG. 4A illustrates a side view of an initial embodiment of the invention in accordance with FIG. 1

FIG. 4A shows a side view of an initial embodiment of the sample configuration from FIG. 1, in which the inner conductor 11 in the base of the additional recess 22 is butt-jointed to the support structure 2. As shown in the Figure, the contact elements 4 protrude longitudinally from the support structure 2. In this case, the contact elements 4 are executed as a coplanar structure, with each of the contact elements 4 being soldered to and thus conductively connected to a conductive path 31 on the lower surface of the support structure 2. Naturally, the conductive paths 31 and the contact elements 4 could also be arranged on the upper surface of the support structure 2 without departing from the fundamental concept behind the invention.

Figure 4B:
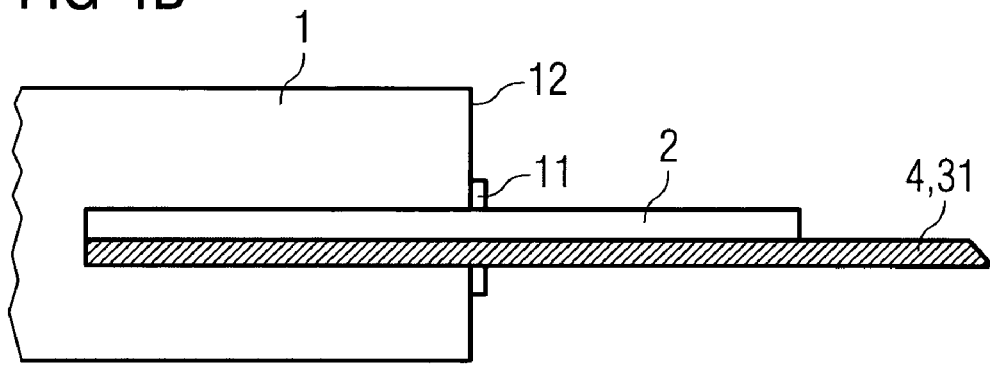
FIG. 4B illustrates a side view of a second embodiment of the invention in accordance with FIG. 1

FIG. 4B shows a side view of an alternative embodiment of the sample configuration from FIG. 1, in which the inner conductor 11 in the base of the additional recess 22 is butt-jointed to the support structure 2. The contact elements 4 again protrude longitudinally from the support structure 2, are executed as a coplanar structure and attached to the lower surface of the support structure. In this embodiment, however, the contact elements are designed in such a way that they themselves form the conductive paths. For this purpose, the contact elements are designed to be of sufficient length to enable their respective ends to be directly and conductively connected to the inner or outer conductor of the coaxial high-frequency wave guide. This dispenses with the need for conductive paths on the support structure.

Figure 5:
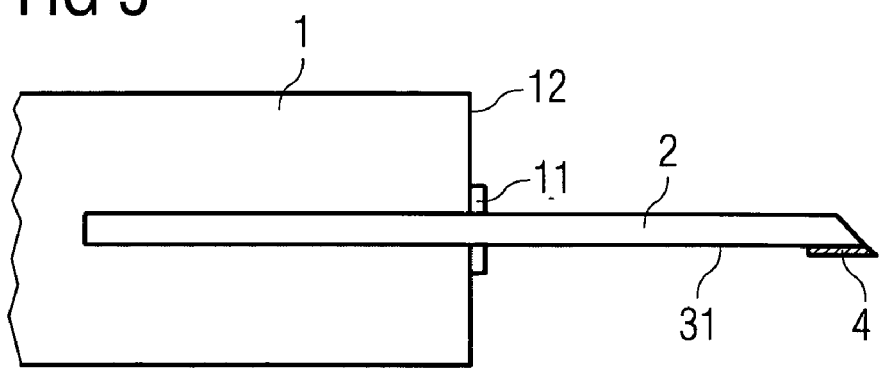
FIG. 5 illustrates a side view of a fourth sample configuration of the invention

A variant of the initial sample configuration is shown in FIG. 5. As shown in this side view, the contact elements 4 also protrude longitudinally from the support structure 2 in this case. The contact elements 4 are also designed as a coplanar structure. To ensure that contact can be reliably achieved, the edge of the plate-like support structure is chamfered, that is, provided with a bevel to ensure that the conductive paths 31 actually form the longest protruding parts of the support structure 2. This variant is particularly cost-effective because it enables the separate contact elements 4 and the processing steps required to attach them to the support structure 2 to be dispensed with.

Figure 6:
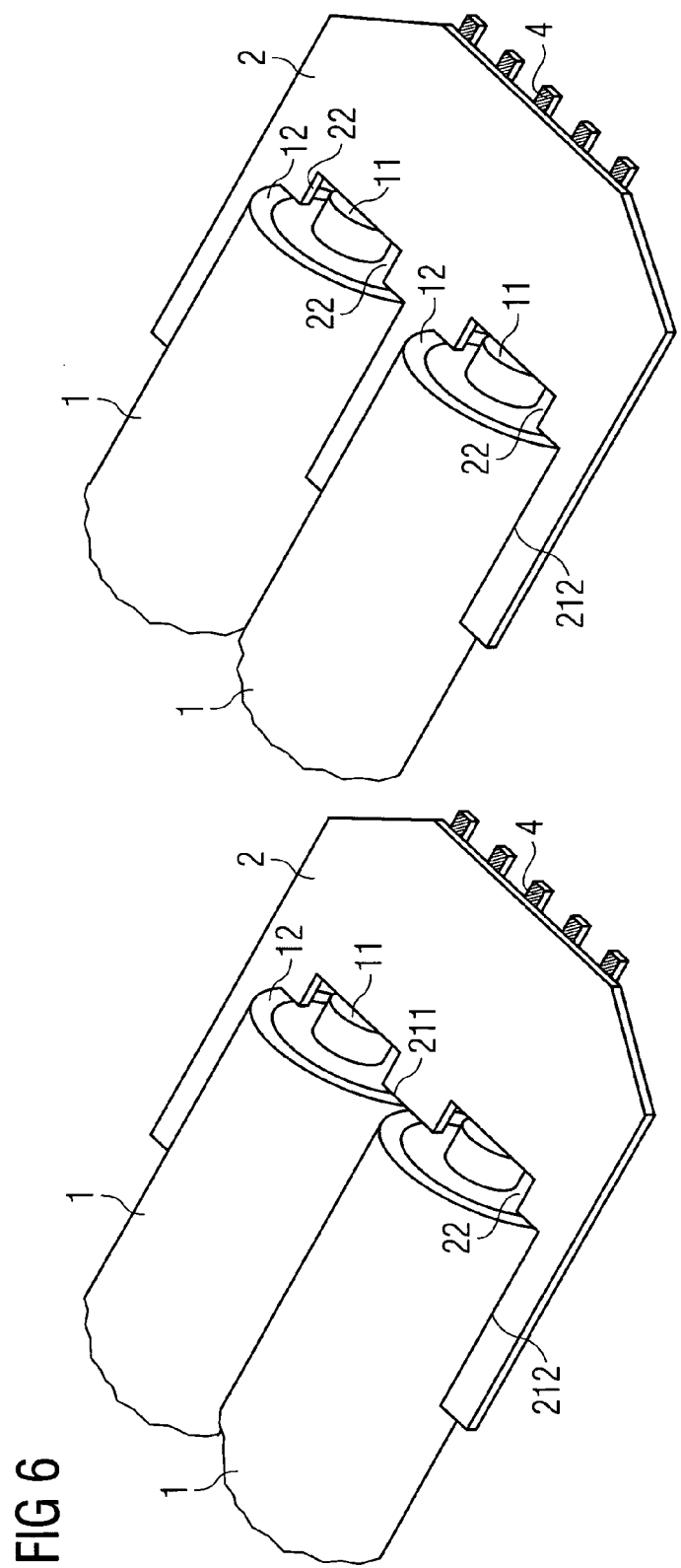
FIG. 6 illustrates an exploded view of a fifth sample configuration of the invention.

Finally, FIG. 6 shows two examples of support structures 2 that are designed to accept multiple coaxial high-frequency wave guides simultaneously. In the example, each support structure 2 can accept two coaxial high-frequency wave guides 1. However, the support structure 2 can also be adapted in the context of the invention to accept any number of coaxial high-frequency wave guides 1.

In the left-hand illustration in FIG. 6 is the U-shaped cut-out 21 of the support structure 2 designed for accepting two coaxial high-frequency wave guides 1. For this purpose, the width of the U-shaped cut-out 21 is essentially equivalent to the overall width of the two coaxial high-frequency wave guides 1 to be accommodated. In this case, it is also advisable to join the two coaxial high-frequency wave guides 1 together, for example, by bonding, soldering or welding in order to increase the mechanical strength of the test probe pursuant to the present invention.

In the right-hand illustration in FIG. 6, the support structure 2 features two U-shaped cut-outs 21, each of which can accommodate a single coaxial high-frequency wave guide 1. Each U-shaped cut-out 21 has two sides 212 and is essentially as wide as the diameter of a coaxial high-frequency wave guide 1, so that each coaxial high-frequency wave guide 1 can be connected to two sides 212 of a U-shaped cut-out. This connection can either be conductive, for example, using soldering or welding or non-conductive, for example, using bonding. If a non-conductive connection type is chosen, additional measures are required to create a conductive connection between the outer conductor 12 and the conductive paths 31 provided.

The invention claimed is:

1. Test probe for executing high-frequency measurements of electronic circuits comprising:
    a coaxial high-frequency wave guide comprising an inner conductor and an outer conductor, the inner conductor adapted to transmit a primary electrical potential and the outer conductor adapted to transmit a secondary electrical potential,
    a support structure connected to at least the outer conductor; and
    at least two contact elements conductively connected to the support structure, the at least two contact elements adapted to contact an electronic circuit to be tested,
    wherein the support structure is provided with conductive paths for transmission of a high-frequency signal from the inner conductor to a first of the at least two contact elements and a high-frequency ground potential from the outer conductor to a second of the at least two contact elements, and
    wherein the support structure comprises at least one U-shaped cut-out having a base and two sides, wherein the sides of the U-shaped cut-out are connected to the outer conductor, and the U-shaped cut-out further comprises a recess in the base and a width of the recess is less than a width of the base of the U-shaped cut-out.

2. Test probe of claim 1, wherein the support structure comprises at least one substantially planar surface.

3. Test probe of claim 1, wherein the contact elements and the conductive paths provide a coplanar wave guide.

4. Test probe of claim 3, wherein the coplanar wave guide has an impedance within a range of 10 to 200 ohm.

5. Test probe of claim 1, wherein the contact elements provide the conductive paths.

6. Test probe of claim 1, wherein the support structure comprises a substantially plate-like form.

7. Test probe of claim 1, wherein all of the conductive paths are arranged on a same surface of the support structure.

8. Test probe of claim 1, wherein the at least two contact elements protrude longitudinally from the support structure.

9. Test probe of claim 8, wherein the contact elements that protrude longitudinally from the support structure comprise resilient contact elements.

10. Test probe of claim 1, wherein the support structure is adapted to accept multiple coaxial high-frequency wave guides simultaneously.

11. Test probe of claim 10, wherein the U-shaped cut-out is adapted to accept multiple coaxial high-frequency wave guides, and a width of the U-shaped cut-out is substantially equivalent to an overall width of the multiple coaxial high-frequency wave guides.

12. Test probe of claim 1, wherein the support structure has multiple U-shaped cut-outs, and each U-shaped cut-out accepts a single coaxial high-frequency wave guide.

13. Test probe of claim 4, wherein the coplanar wave guide has an impedance within a range of 40 to 60 ohm.

14. Test probe of claim 13, wherein the coplanar wave guide has an impedance of 50 ohm.

15. Test probe of claim 1, wherein a width between the sides of the U-shaped cut-out is substantially equivalent to an outer diameter of the coaxial high-frequency wave guide.

16. Test probe of claim 1, wherein the sides of the U-shaped cut-out are substantially parallel to an axis of the coaxial high-frequency wave guide.

17. Test probe of claim 1, wherein the sides of the U-shaped cut-out are substantially perpendicular to the base of the U-shaped cut-out.

18. Test probe of claim 1, wherein the conductive paths comprise conductive strips mounted to the support structure.

* * * * *